June 28, 1960 D. RANDISE 2,943,267

SERIES-ENERGIZED TRANSISTOR AMPLIFIER

Filed Oct. 31, 1955

INVENTOR
DOMINICK RANDISE
BY R. V. Craddock
ATTORNEY

United States Patent Office 2,943,267

Patented June 28, 1960

2,943,267

SERIES-ENERGIZED TRANSISTOR AMPLIFIER

Dominick Randise, Ozone Park, N.Y., assignor to Sperry Rand Corporation, Great Neck, N.Y., a corporation of Delaware Filed Oct. 31, 1955, Ser. No. 543,741

3 Claims. (Cl. 330—18)

This invention relates generally to transistor circuits, and more particularly, is concerned with high gain transistorized voltage amplifiers.

While various high gain amplifiers including several transistor stages have been heretofore proposed, such known amplifiers are limited in the linear voltage swing of the output. This results from the limitations of the transistors themselves in withstanding large voltages without saturating. Push-pull type amplifiers provide larger output voltages without saturating the transistors; but at best the improvement is no more than a factor of two.

It is the general object of this invention to provide an improved transistorized amplifier capable of producing high voltage output signals.

Another object of this invention is the provision of a substantial voltage swing in the output of a transistorized amplifier without clipping due to cut-off or saturation of the transistors.

Another object of this invention is to provide a transistor type amplifier providing increased power output with substantially no distortion.

These and other objects of the invention that will become apparent as the description proceeds are achieved by providing one common-emitter type transistor input stage serially connected to a plurality of common-base type transistor stages. A common load resistor is connected in series with the serially connected transistors across a potential source. The A.-C. voltage gain of each stage is controlled by the impedance to ground of the respective bases.

Figure 1:
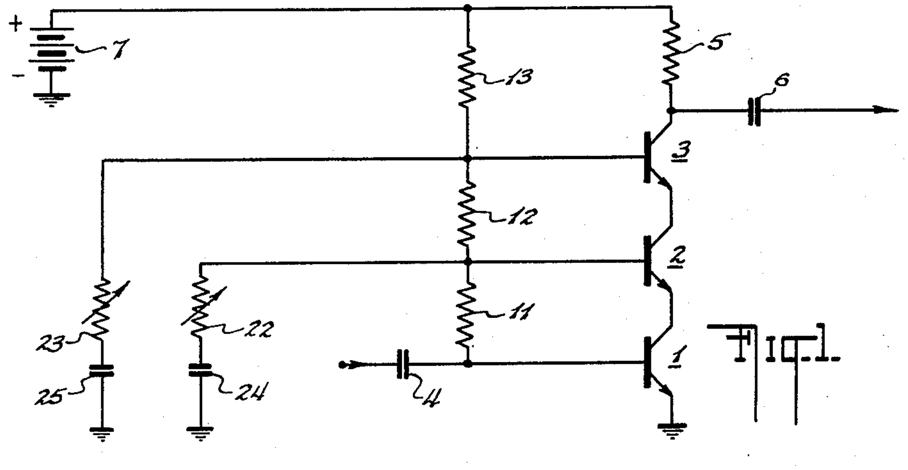
Figures 2, 3:
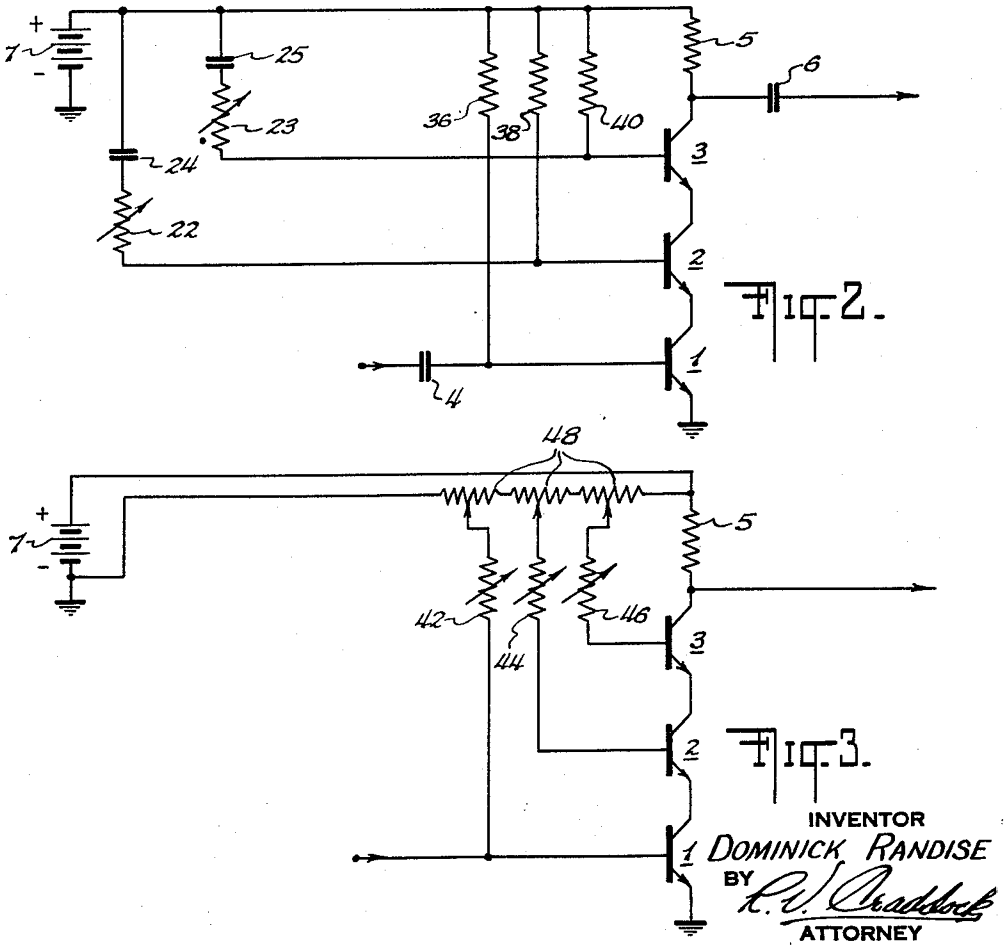

For a better understanding of the invention reference should be had to the accompanying drawing, wherein, Fig. 1 is a schematic diagram of one embodiment of the invention; and Fig. 2 is a schematic diagram of a modification of the circuit of Fig. 1; and Fig. 3 is a schematic diagram of a direct-coupled amplifier embodiment of the invention.

Referring to Fig. 1, a three stage amplifier circuit is shown including transistors 1, 2, and 3, which are preferably of the npn junction type. The first stage is connected as a common-emitter type circuit with the input signal being coupled to the base of the transistor 1 through an input capacitor 4. The successive stages are connected as common-base type circuits with the respective emitter and collector electrodes of the transistors serially connected. A common load resistor 5 is connected to the collector of the transistor 3 to form a series circuit with the transistors 1, 2, and 3, this series circuit being connected across a D.-C. potential source 7, providing a D.-C. potential E. The output is derived from the collector of the last transistor by means of a coupling capacitor 6.

The proper operating base current level for each transistor is established by a plurality of resistors 11, 12, and 13 connected between the respective bases and to the potential source 7. The values of the resistors 11, 12, and 13 to provide proper quiescent operating conditions for the amplifier are established in the manner hereinafter described.

While the circuit has been shown as including three series stages, the invention may be practiced with any number of such stages as required to get the desired voltage swing across the load. In choosing the transistors and impedance elements of the circuit, however, certain design limitations must be considered. For example, one is generally confronted with the problem of driving a predetermined load with a desired maximum peak-to-peak A.-C. voltage swing. This establishes the minimum D.-C. supply voltage, which voltage must be at least equal to the peak-to-peak voltage of the output, and the quiescent current through the load, which is equal to the average voltage or one-half the peak-to-peak voltage divided by the load resistance. Since the quiescent current flows through all the transistors in series, transistors must be chosen that operate at such a quiescent current level.

Once the transistors are chosen, the quiescent voltage from base to collector, assuming that base-to-emitter voltage is substantially zero, is selected. The base-to-collector voltage drop per transistor, of course, is determined by the number of transistor stages, since the balance of the supply voltage (approximately one-half) not appearing across the load is preferably divided equally across the several transistors in series with the load. The number of transistors and the voltage drop across the transistors is selected to make each transistor operate at suitable quiescent operating points where the peak-to-peak voltage swing per transistor will not exceed safe design operation limits. These limits can be readily determined by reference to the manufacturer's specification on the transistor or by taking suitable measurements.

The values of the D.-C. bias resistors 11, 12, and 13 can then be calculated, knowing the common-base amplification factor $\alpha$ of the transistors 2 and 3 and the common-emitter amplification factor $\beta$ of the transistor 1, $\alpha$ and $\beta$ being related by the following expression:

$$\beta=\frac{\alpha}{1-\alpha} \qquad (1)$$

The factor $\alpha$ is a constant associated with the particular transistor used and is readily ascertained.

From the above information, namely, the value of the quiescent load current, designated $I_L$, the base-to-collector voltage of the several transistors, designated $V_{c1}$, $V_{c2}$, . . . $V_{cn}$ respectively, and the value of $\beta$ for each transistor, designated $\beta_1$, $\beta_2$, . . . $\beta_n$, the base current $I_b$ of each stage can be derived from the following equations:

$$I_{bn}=\frac{1}{\beta_n}I_L \qquad (2)$$

$$I_{bn-1}=\frac{1}{\beta_{n-1}}(I_L+I_{bn}) \qquad (3)$$

$$I_{b1}=\frac{1}{\beta_1}(I_L+I_{bn}+\ .\ .\ .\ +I_{b2}) \qquad (4)$$

Knowing the base currents of each of the transistors, the resistance value R of each of the bias resistors can be calculated from the following equations:

$$R_1=\frac{V_{c1}}{I_{b1}} \qquad (5)$$

$$R_2=\frac{V_{c2}}{I_{b1}+I_{b2}} \qquad (6)$$

$$R_{n-1}=\frac{V_{cn-1}}{I_{b1}+I_{b2}+\ .\ .\ .\ I_{bn-1}} \qquad (7)$$

$$R_n=\frac{V_{cn}+V_L}{I_{b1}+I_{b2}+\ \dots\ I_{bn}} \quad (8)$$

where $R_1$ is the resistance connected to the base of the first or input transistor 1, and $R_2$ . . . $R_n$ are the resistors connected to the successive transistors 2, . . . $_n$.

For example, suppose it is desired to operate into a load of 10,000 ohms with a peak-to-peak voltage swing of 60 volts. This requires a supply voltage of 60 volts and a load current of 3 ma. By using three transistor stages, the base-to-collector voltage is accordingly 10 volts per transistor stage. If the transistors have an $\alpha$ of, for example, .95, from the above Equations 1–8:

$$\beta=19$$

| | |
|---|---|
| $I_{b3}$=.16 ma. | $R_1$=59,000 ohms |
| $I_{b2}$=.17 ma. | $R_2$=39,000 ohms |
| $I_{b1}$=.17 ma. | $R_3$=100,000 ohms |

In the operation of the circuit in response to an A.-C. input signal it is desirable that the voltage swings of the outputs of the transistors be approximately equal. If each transistor has the same output voltage swing, each will contribute equally to the output voltage swing of the circuit and no one transistor will be overloaded or driven outside its linear operating range.

Thus, with the voltage swing from the collector to ground of the first stage being equal to some value *e*, the voltage swing from the collector to ground of the second stage should be 2*e*, and of the third stage should be 3*e*, etc. If the amplifier has three transistors in series, for example, the voltage gain of the second transistor stage should be 2 and the voltage gain of the third stage should be 3/2. If there were a fourth stage, it should have a gain of 4/3, etc.

The A.-C. gain of the common-base transistor stages is given by the relation:

$$A_v=\frac{\alpha R_L}{r_e+(r_b+Z_b)(1-\alpha)}=\frac{Z_{out}}{Z_{in}} \quad (9)$$

where $R_L$ is the A.-C. load impedance in the collector, $r_e$ and $r_b$ are respectively the internal emitter and base impedances of the transistor, and $Z_b$ is the external base impedance. It will be seen that in the last stage of the circuit of Fig. 1 as thus far described, assuming the A.-C. impedance of the supply voltage 7 is quite low, the load impedance is equal to the resistance of the load resistor 5 while the A.-C. impedance of the base to ground is substantially equal to the internal base resistance of the transistor 3 plus the bias resistor 13, neglecting the shunting effect of the resistors 11 and 12. Thus the gain of the last stage is approximately as follows:

$$A_{vn}=\frac{\alpha_n R_L}{r_{en}+(r_{bn}+R_n)(1-\alpha_n)}$$

It has been found, however, with the values of $R_L$ and $R_n$ fixed by other considerations than gain, the actual gain of the last stage is generally smaller than required, since the bias resistor 13 in the base circuit makes an input impedance $Z_{in}$ of the last stage fairly large.

To decrease the input impedance of the last stage, a variable resistor 23 in series with a D.-C. blocking capacitor 25 shunts the bias resistor 13 to provide a low A.-C. impedance to ground. By adjusting the value of the variable resistor, the gain of the last stage can be set at the desired value.

Similarly the gain of all the other common-base transistor stages can be increased and adjusted to the desired value by providing an adjustable A.-C. impedance path to ground. Thus the base of the second stage of Fig. 1 is provided with a variable resistor 22 and blocking capacitor 24 in series connection to ground. The gain of the common-emitter type first stage is fixed by the impedance of the signal source, since the output impedance is predetermined by the design of the subsequent stages as outlined above.

An alternative biasing arrangement is shown in the circuit of Fig. 2. Here each transistor base is separately biased by a resistor connected to the supply voltage source, such as indicated at 36, 38 and 40. The A.-C. gain of this modified circuit is controlled in the same manner as the circuit of Fig. 1. The respective base currents are calculated in the same manner as before in Equations 2, 3 and 4. Once the base currents are known as calculated by Equations 2, 3 and 4, the values of the resistors 36, 38 and 40 can be readily determined since the voltages across the resistors are known. The A.-C. gain control circuits, including the variable resistors 22 and 23 and blocking capacitors 24 and 25, may be connected to the supply voltage source rather than directly to ground, as shown in Fig. 2, since the internal impedance of the supply voltage generally is low.

In Fig. 3, a direct-coupled amplifier circuit is shown. The D.-C. bias of the several transistor stages is derived from a low impedance variable-tap voltage divider 48 across the common supply voltage source 7, in which case the bias resistors 42, 44, and 46 and the divider 48 may be adjusted in value to give both the proper D.-C. bias condition and the desired gain of the associated transistor stages.

It will be seen from the above description that the various objects of the invention have been achieved by the above described circuits. A relatively large voltage swing at the output can be achieved without exceeding the design limitations of the individual transistors. Any number of transistor stages may be used as required to achieve a greater output voltage swing, the only limitation being that the current capacity of the transistors in series not be exceeded.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A transistor amplifier comprising a plurality of transistors each including a collector electrode, an emitter electrode, and a base electrode, a single load resistor, the transistors being series connected with the collector electrode of one transistor connected solely to the emitter electrode of the next transistor and the collector electrode of the last transistor being connected to one terminal of said load resistor to provide an A.-C. series circuit between the emitter electrode of the first of said series connected transistors and the other terminal of said load resistor, whereby substantially the same signal current passes through said load resistor and the emitter and collector electrodes of each of said transistors of said series circuit, a potential source connected across said series circuit, the input signal being coupled to the base electrode of said first transistor, a plurality of impedance circuits each including a resistor and capacitor in series connecting the emitter electrode of said first transistor to the base electrodes of the remaining transistors, and a plurality of bias resistors connecting the base electrodes of the transistors to said other terminal of said load resistor.

2. Apparatus as defined in claim 1 wherein said bias resistors are in series with each other.

3. A transistor amplifier for amplifying an A.-C. input signal comprising a first transistor and at least one additional transistor each including a collector electrode, an emitter electrode, and a base electrode, a load impedance, the transistors being series connected with the collector electrode of one transistor connected solely to the emitter electrode of the next transistor and the collector electrode of the last transistor being connected to the load impedance to provide an A.-C. series circuit wherein substantially the same signal current passes through the load impedance and the emitter and collector electrodes of each of said transistors of said series circuit, means for applying a D.-C. potential across the load impedance and transistors in series, means for applying a D.-C. potential to the base electrode of each of the transistors, and a plurality of impedance circuits each including a resistor and capacitor in series connecting the emitter electrode of said first transistor to the base electrode of each said additional transistor.

References Cited in the file of this patent

UNITED STATES PATENTS

| | | |
|---|---|---|
| 1,986,597 | Nyman | Jan. 1, 1935 |
| 2,088,061 | Hollmann | July 27, 1937 |
| 2,613,286 | Hare | Oct. 7, 1952 |
| 2,666,817 | Raisbeck et al. | Jan. 19, 1954 |
| 2,764,643 | Sulzer | Sept. 25, 1956 |
| 2,774,826 | Moulon | Dec. 18, 1956 |
| 2,776,372 | Ensink et al. | Jan. 1, 1957 |

FOREIGN PATENTS

| | | |
|---|---|---|
| 559,078 | Great Britain | Feb. 3, 1944 |

OTHER REFERENCES

Shea text, "Principles of Transistor Circuits," pp. 112–113, pub. 1953 by John Wiley & Sons, Inc., N.Y.C.

Beter et al.: "Directly Coupled Transistor Circuits," reprint from Electronics, June 1955, published by Philco Corp.